United States Patent
Bonen

(10) Patent No.: US 10,505,499 B1
(45) Date of Patent: Dec. 10, 2019

(54) POWER SAVING BY CONFIGURABLE ADJUSTMENT OF POWER AMPLIFIER

(71) Applicant: Harmonic, Inc., San Jose, CA (US)

(72) Inventor: Adi Bonen, Belle Mead, NJ (US)

(73) Assignee: Harmonic, Inc., San Jose, CA (US)

( * ) Notice: Subject to any disclaimer, the term of this patent is extended or adjusted under 35 U.S.C. 154(b) by 0 days.

(21) Appl. No.: 16/372,952

(22) Filed: Apr. 2, 2019

Related U.S. Application Data

(60) Provisional application No. 62/657,595, filed on Apr. 13, 2018.

(51) Int. Cl.
*H03F 1/02* (2006.01)
*H02M 1/00* (2006.01)

(52) U.S. Cl.
CPC ... *H03F 1/0272* (2013.01); *H02M 2001/0045* (2013.01); *H03F 2200/504* (2013.01)

(58) Field of Classification Search
CPC .................................................. H03F 1/0211
USPC ................................ 330/127, 297, 296, 285
See application file for complete search history.

(56) References Cited

U.S. PATENT DOCUMENTS

| | | | | |
|---|---|---|---|---|
| 7,420,421 B1* | 9/2008 | Lie | ......................... | H03F 1/0211 330/296 |
| 7,443,244 B2* | 10/2008 | Hagen | ................... | H03F 1/0227 330/285 |
| 7,593,702 B1* | 9/2009 | Lie | ......................... | H03F 1/0211 330/285 |
| 8,742,843 B2* | 6/2014 | Cowley | .................... | H03G 3/20 330/127 |
| 2014/0184335 A1* | 7/2014 | Nobbe | .................. | H03F 1/0227 330/291 |
| 2015/0180421 A1* | 6/2015 | Balteanu | .................. | H03F 1/02 455/571 |

\* cited by examiner

*Primary Examiner* — Henry Choe
(74) *Attorney, Agent, or Firm* — Brokaw Patent Law PC; Christopher J. Brokaw

(57) ABSTRACT

Configurable adjustment of a power amplifier bias for a power amplifier. The power amplifier may be comprised within a variety of different apparatuses, such as without limitation a remote PHY node, a remote MACPHY node, and a wireless communication device. A processing unit, disposed within an apparatus, instructs an electrical circuit, also disposed within said apparatus, to change an RF signal output power carrying capability of the power amplifier based on a configuration. The configuration may, but need not, be maintained within the apparatus. The change in the RF signal output power carrying capability of the power amplifier causes an adjustment in a power consumption of the power amplifier.

25 Claims, 3 Drawing Sheets

POWER SAVING BY CONFIGURABLE ADJUSTMENT OF POWER AMPLIFIER

CLAIM OF PRIORITY

The present application claims priority to U.S. Provisional Patent Application No. 62/657,595, entitled 'Power Saving by Dynamic Adjustment of a Power Amplifier Bias in a Remote PHY and Remote MACPHY nodes,' invented by Adi Bonen, filed on Apr. 13, 2018, the entire disclosure of which is hereby incorporated by reference in its entirety for all purposes as if fully set forth herein.

FIELD OF THE INVENTION

Embodiments of the invention generally relate to the configurable adjustment of a power amplifier bias.

BACKGROUND

Hybrid Fiber Coax (HFC) is a term that refers to a broadband network based on a combination of optical fiber and coaxial cable. A HFC architecture is often used by cable TV (CATV) operators. In modern cable TV networks, optical fiber is used to transport data between the headend and an optical node deployed in a neighborhood or area of service, while coaxial cable is used to transport data between the optical node and the local houses and locations in the area of service of that optical node.

Over the years, the CATV hybrid Fiber Coax (HFC) architecture has evolved such that the optical node is deployed increasingly closer to the cable customers' premises. Older HFC systems deployed long chains of amplifiers (potentially arranged in a tree structure) between the optical node and cable customers' homes. Over time, amplifier chains have become shorter by segmenting a single long chain of amplifiers to result in multiple smaller chains connected to multiple optical nodes, such that the same area of service previously supported by a single optical node is now serviced by a plurality of optical nodes.

The size of the service domains of an optical node are often quantified not by the length and reach of the coaxial cables, but rather by the number of amplifiers used in the path of the coaxial cable between the optical node and the cable customers. For example an N+6 deployment signifies that there are as many as 6 amplifiers cascaded between the optical node (N) and the customer.

In an amplifier chain, each amplifier typically receives as input a low level RF signal from the end of a coaxial cable segment, amplifies the received RF signal, and outputs the amplified RF signal onto the next coaxial cable segment. Each such amplifier introduces undesirable noise and distortion to the RF signal. For this reason, shorter amplifier chains generally result in a better signal quality delivered to the cable customer. To enable a longer reach between amplifiers, the power level at the output of each amplifier is increased.

Recently, Fiber Deep (FD) deployments have become popular, as they represent the next stage in evolution of cable networks. In a FD deployment, optical fiber is extended from the cable operator's headend or hub deep into the CATV outside plant, close to the customers' premises, into an optical node that produces RF signals for final distribution over the coaxial network. Another term used to describe this architecture is N+0, where N stands for the optical node and zero signifies that there are no (zero) standalone RF amplifiers between the optical node and the customers' premises. Since there are no additional amplifiers that can degrade the RF signal fidelity, such deployments often use optical nodes with very high output integrated power amplifiers. These High Output (HO) optical nodes are designed to drive the RF signal into a distribution coax network directly (i.e., without being amplified by further amplifiers) into cable subscriber homes. A typical high output FD optical node comprises 4 output ports, each of which is driven by a dedicated high output RF power amplifier.

Due to their strict linearity requirements and large active RF bandwidth, power amplifiers in both Remote PHY optical nodes and Remote MACPHY optical nodes normally operate as Class A amplifiers, rendering them very inefficient. A Class A power amplifier is an amplifier in which the amplifier bias is set such that the amplifier is not driven into its cut-off or saturation regions by the signal it amplifies. Thus, a Class A amplifier exhibits the lowest signal distortion levels and has the highest linearity over the other amplifier classes. This is at the expense of lower power conversion efficiency, which is measured as signal output power divided by the total power consumed by the amplifier.

Although advances in amplifiers have been made over the years, with newer GaN (Gallium Nitride) amplifiers having improved efficiency over prior GaAs (Gallium Arsenide) amplifiers, the typical achievable efficiency of the best high output CATV power amplifiers remains lower than 3.5% at the power amplifier output and less than 2% at the optical node output. The most advanced and highest output power amplifiers presently available consume about 18 W of power to enable about 0.3 W RMS RF power at the output of the optical node. In a typical Remote PHY node having 4 node ports, more than half of the power consumed by the Remote PHY node is consumed by the 4 high output RF power amplifiers for those 4 node ports.

FIG. 1 is an illustration of power amplifier 10 which may be used in the prior art. Many power amplifiers in the prior art allow for lowering the amplifier bias current of power amplifier 10 using adjustable bias current control 12 having a fixed predetermined bias that is established at time of manufacture. Also in the prior art, voltage source 14 may use a lower voltage than is typically used with power amplifier 10. In either case, not only will the power consumed by power amplifier 10 be reduced, but the maximum RF signal power of RF out signal 16 that power amplifier 10 can output without generating significant distortions will also be reduced.

For this reason, when power amplifiers are used in optical nodes which require a lower RF signal power than the maximum capability of the power amplifier, it is standard procedure to design and manufacture the optical node to employ a lower current bias in the power amplifier. The level of the current bias for the power amplifier is adjusted down by design to a level which is just sufficient to support the desired RF signal output power without generating distortions. Doing so enables the power consumption of the power amplifier, and the optical node in which it is installed, to be lowered while still allowing for the output signal to be generated with sufficient fidelity. When such bias adjustment is practiced, it is done during the design and/or manufacturing of the optical node. Consequently, the power consumption of the power amplifier, and thus by extension the maximum power of the RF signal output that the power amplifier can support as part of an optical node, is fixed for the life of the optical node.

BRIEF DESCRIPTION OF THE DRAWINGS

Embodiments of the invention are illustrated by way of example, and not by way of limitation, in the figures of the accompanying drawings and in which like reference numerals refer to similar elements and in which.

DETAILED DESCRIPTION OF THE INVENTION

Figure 1:
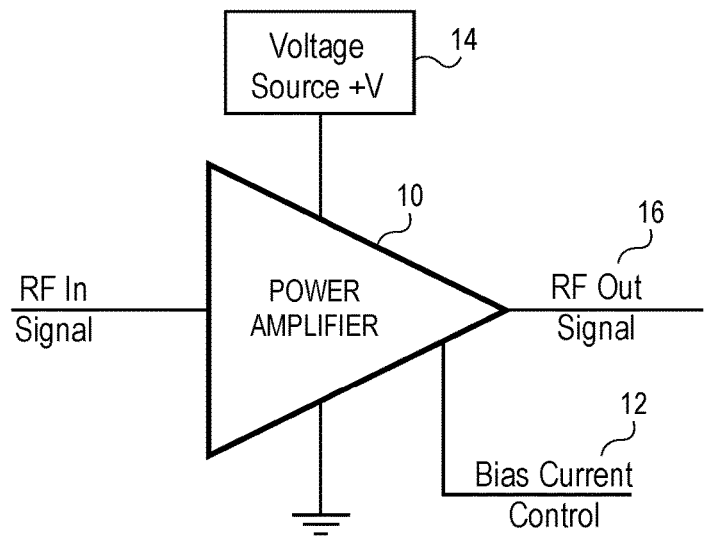
FIG. 1 is an illustration of a power amplifier having an adjustable bias current control according to the prior art.

Approaches for configurable adjustment of a power amplifier bias for a power amplifier are presented herein. In the following description, for the purposes of explanation, numerous specific details are set forth in order to provide a thorough understanding of the embodiments of the invention described herein. It will be apparent, however, that the embodiments of the invention described herein may be practiced without these specific details. In other instances, well-known structures and devices are shown in block diagram form or discussed at a high level in order to avoid unnecessarily obscuring teachings of embodiments of the invention.

Functional Overview

It may be desirable to repurpose an apparatus, such as an optical node, for use in a new context that requires a different RF signal output power capability than which it currently possesses. In the case of optical nodes, the bias of any power amplifiers comprised within are adjusted in advance (i.e., during manufacturing) for the worst case (i.e., highest) desirable RF signal output power. Thus, anytime that the optical node is operating at lower RF signal output power, the power amplifier efficiency is lower than what is required at that time, and the optical node consumes higher power than required at that time, thus wasting power.

The RF spectrum at the output of a Remote PHY node (as is the case in other nodes) has a large positive tilt, i.e., higher frequency signals possess higher amplitude and power. This large positive tilt is due to the larger attenuation experienced by higher frequency signals in both coaxial cables and other passive devices used in the cable plant (such as splitters and taps). Since higher frequency signals possess higher power, the higher frequency signals are responsible for most of the power consumed by the power amplifier.

For example, a typical RF spectrum power profile in a Remote PHY node has 22 dB of linear positive tilt across the downstream spectrum from 54 MHz to 1218 MHz. Positive tilt means that higher frequencies have higher power; so in this example, the signal occupying the 6 MHz bandwidth near 1218 MHz is 22 dB higher that the 6 MHz bandwidth near 54 MHz. Linear tilt means that a constant power slope is applied across the spectrum between 54 MHz and 1218 MHz, which amounts to an increase of about 1 dB in signal power for frequency increase of 53 MHz.

As a result of the large positive tilt at the output of an optical node, a large amount of the power is concentrated in higher frequencies. In the RF spectrum power profile of the above example, the spectrum portion above 1 GHz, which is less than 20% of the total downstream portion supported by an optical node in this example, contains more than 60% of the total RF power.

Recently, cable deployment has seen quite a few growth steps with respect to the amount of spectrum used. As a result, cable operators normally plan, design, and deploy equipment (including optical nodes) to support higher downstream spectrum capability than can be utilized when the equipment is first deployed. All portions of a cable plant must be capable of higher spectrum utilization before such higher spectrum capability can actually be used. Even when all the cable plant elements of a certain portion of the plan are capable of higher spectrum utilization, it is often not possible to utilize that higher portion of the spectrum due to the desire to have all portions of the cable plant to use the same level of service and channel lineup. As a result, higher frequency utilization may be held back for some time until all portions of the cable plant are upgraded and all the subscribers served by the cable plant can enjoy such advancement.

Consequently, cable equipment (including optical nodes) is typically deployed with maximum limitations enabling higher frequency capability than what it actually carries for several years. Specifically for power amplifiers in an optical node, these power amplifiers are biased to support the fully possible utilization, and thus typically for several years they consume more power than strictly required by the current RF signals they process.

Figure 2:
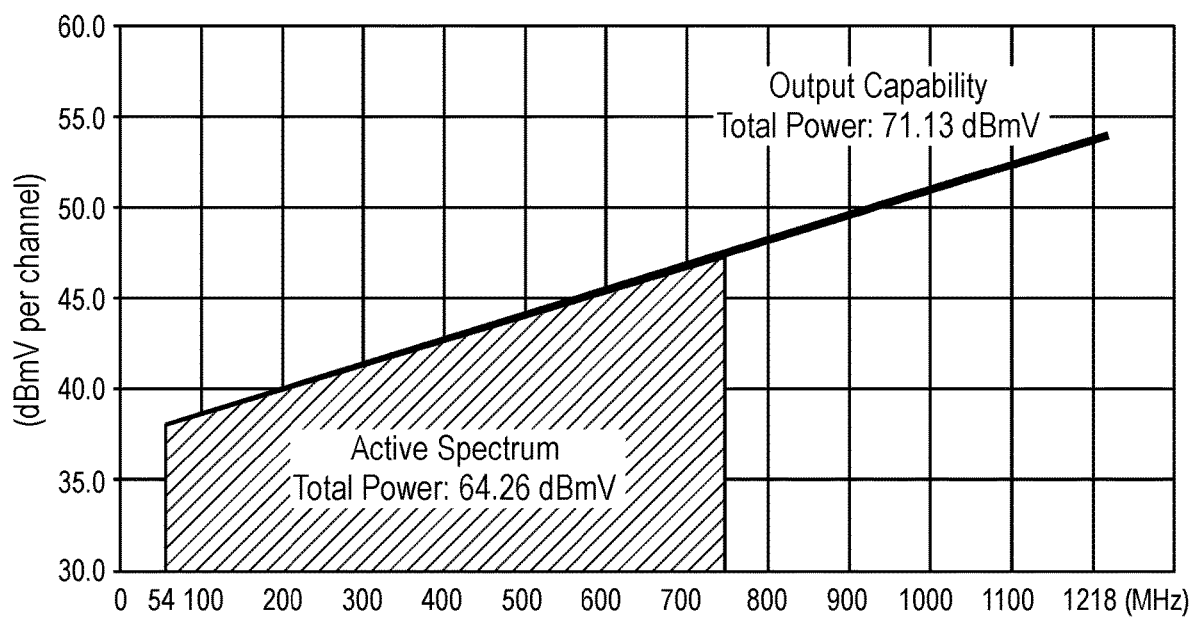
FIG. 2 is a graph depicting a RF spectrum power profile for a Remote PHY node in accordance with the existing state of the art.

For example, consider FIG. 2, which is a graph depicting a RF spectrum power profile for a Remote PHY node in accordance with the existing state of the art. The RF spectrum power profile shown in FIG. 2 has an active spectrum up to 750 MHz vs. a node capability of RF spectrum up to 1218 MHz with a moderate positive tilt of 16 dB. An optical node deployed to support RF signals up to 1218 MHz may be initially used with RF signal up to typical values such as 750 MHz, 870 MHz or 1002 MHz. During which time the amplifiers consume the power required for RF spectrum up to 1218 MHz. If the amplifier was biased to support RF signals only up to 1002 MHz, about 60% of the power consumed by the amplifier could have been saved, but that would have prevented the node from being used to handle RF signals above 1002 MHz.

Advantageously, approaches are discussed herein for a configurable adjustment of a power amplifier bias for a power amplifier. The power amplifier may be used within an optical node, such as a Remote PHY node or a Remote MACPHY node, but the power amplifier may also be used in other contexts, such as but not limited to a wireless communication device.

In an embodiment, a processing unit, disposed within an apparatus, instructs an electrical circuit, also disposed within the same apparatus, to change an RF signal output power carrying capability of the power amplifier based on a configuration. The change in the RF signal output power carrying capability of the power amplifier causes an adjustment in a power consumption of the power amplifier.

The change in the RF signal output power carrying capability of the power amplifier is based on a configuration. This configuration may consider a number of factors and data about observations made about the apparatus in which the power amplifier is deployed.

Before discussing in further detail how embodiments of the invention operate, it will be helpful to review a discussion of exemplary implementing apparatuses.

Physical Description of Optical Node

Embodiments of the invention may be used in conjunction with one or more power amplifiers in a variety of different types of apparatuses, including optical nodes and wireless communication devices. To provide a concrete example of an implementing mechanism, a description of a particular type of optical node, Remote PHY node, will be presented. Embodiments of the invention may also be used in conjunction with other types of optical nodes, such as a Remote MACPHY node.

Figure 3:
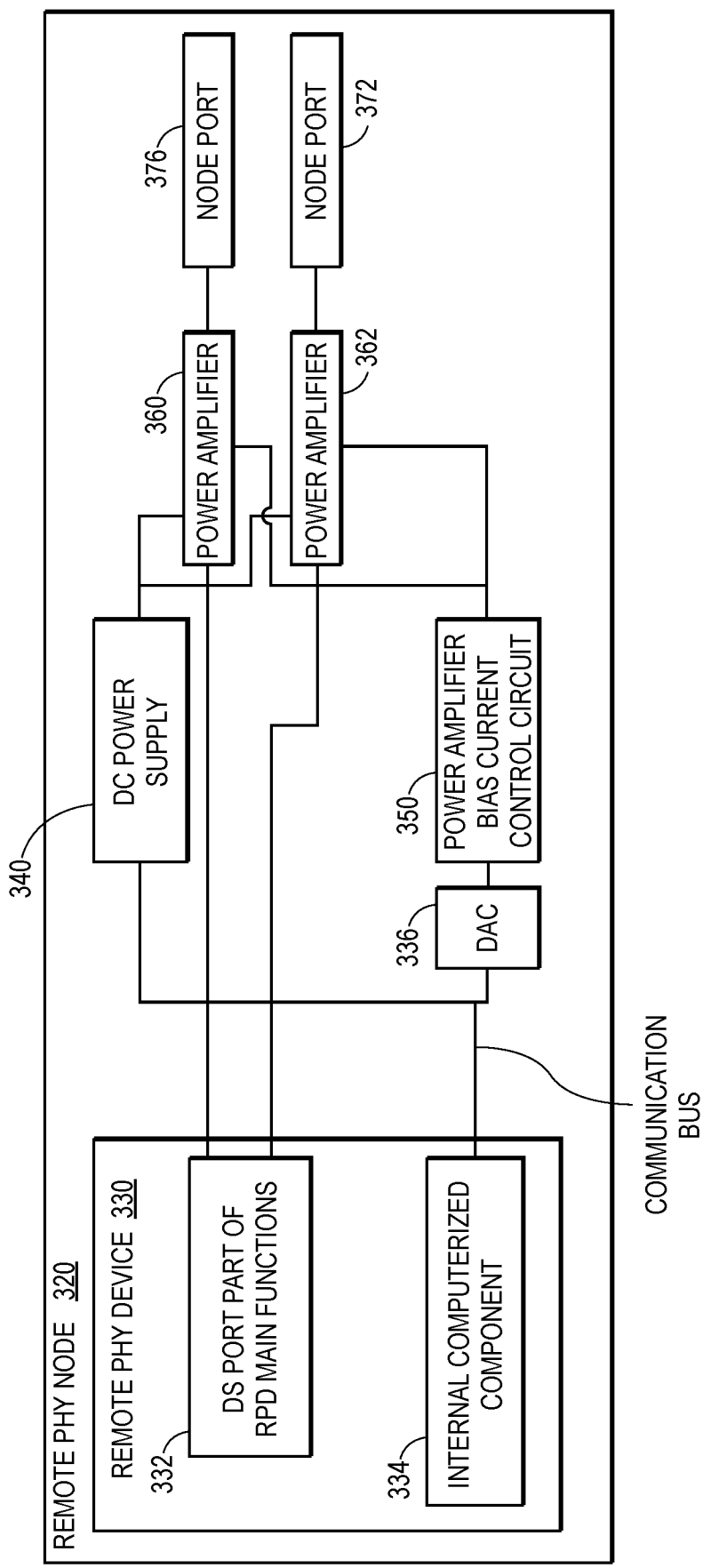
FIG. 3 is a block diagram of a Remote PHY node (RPN) in which an embodiment of the invention may be implemented.

FIG. 3 is a block diagram of a Remote PHY node (RPN) 320 in which an embodiment of the invention may be implemented. The function of RPN 320 is to convert downstream DOCSIS data, MPEG video, and out-of-band (OOB) signals from digital to analog one way and transmit them over a plurality of coaxial cables leading to cable subscribers' homes, and receive upstream data, video, and OOB signals from coaxial cables in analog format and convert them to digital the other way. The digital signals are exchanged between the CCAP Core and Remote PHY Device (RPD) 330, comprised within RPN 320, typically over digital fiber.

Remote PHY nodes, such as RPN 320, are designed to be deployed outdoors near the physical area to be serviced by RPN 320. A non-limiting, illustrative example of RPN 320 includes Harmonic, Inc.'s CableOS™ Ripple-1 Remote PHY node.

RPN 320 is composed of an outer housing that surrounds at least one power supply 340 and at least one Remote PHY Device (RPD) 330. While only one RPD 330 is depicted in RPN 320 in FIG. 3, other embodiments may employ two or more RPD 330 disposed within a RPN 320. The outer housing of RPN 320 is designed to provide a hermetically sealed environment to the interior of RPN 320. The hermetically sealed environment provided by the outer housing of RPN 320 helps protect internal components such as power supply 340 and RPD 330 from outdoor environmental factors, such as humidity, water, debris, and changes in pressure.

RPD 330 is a device which performs many of the functions involved in converting downstream DOCSIS data, MPEG video, and out-of-band (00B) signals from digital to analog. These functions are depicted in FIG. 3 as being performed by DS Port Part of RPD main functions 332. RPD 330 may also comprise internal computerized component 334, which is responsible for certain responsibilities discussed herein, such as configurable adjustment of a power amplifier bias for a power amplifier. A non-limiting, illustrative example of Remote RHY device 330 is Harmonic, Inc.'s CableOS™ Pebble-1 Remote PHY device.

In addition to data transmitted through RPD 330 to and from cable subscribers, and in addition to communications required to fulfill the operation of the DS Port Part of RPD main functions 332, Internal Computerized Component 334 of RPD 330 may send and receive data communications over the optical network (or over a wireless network in contexts where such a network is available). This advantageously allows an operator or technician to send and receive data to RPN 320 deployed in the field, such as for purposes of configuring the operation of RPN 320 and/or providing additional or revised data or executable instructions to Internal Computerized Component 334.

Dynamically Adjusting Power Amplifier Bias

Figure 4:
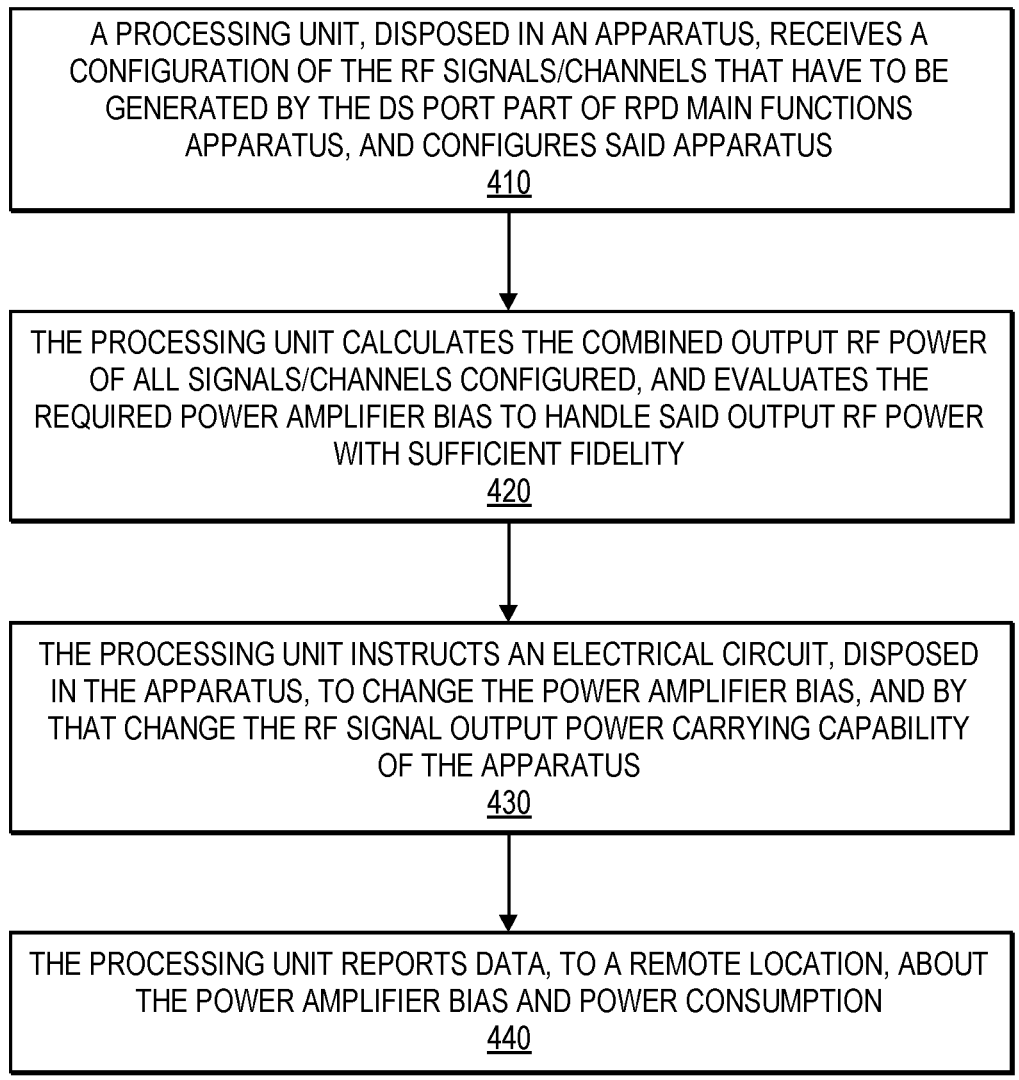
FIG. 4 is a flow chart of the functional steps of the configurable adjustment of a power amplifier bias for a power amplifier in accordance with an embodiment of the invention.

FIG. 4 is a flow chart of the functional steps of the configurable adjustment of a power amplifier bias for a power amplifier in accordance with an embodiment of the invention.

In step 410, a processing unit, disposed in an apparatus, receives a configuration of the RF signals/channels that have to be generated by the DS Port Part of RPD main functions apparatus, and configures said apparatus.

In step 420, the processing unit calculates the combined output RF power of all signals/channels configured, and evaluates the required power amplifier bias to handle said output RF power with sufficient fidelity.

In step 430, the processing unit instructs an electrical circuit, disposed in the apparatus, to change the power amplifier bias, and by that change the RF signal output power carrying capability of a power amplifier of the apparatus.

In step 440, the processing unit may report data, to a remote location, about the power amplifier bias and power consumption.

In an embodiment implemented on RPN 320, steps 410 to 440 may be performed by internal computerized component 334 instructing power amplifier bias current control circuit 350 to change an RF signal output power carrying capability of a power amplifier (either power amplifier 360 or power amplifier 362) of Remote PHY node 320. For purposes of providing a clear description, the steps of FIG. 4 will be described with reference to internal computerized component 334 instructing power amplifier bias current control circuit 350 to change an RF signal output power carrying capability of power amplifier 360; however, internal computerized component 334 may be configured to change the RF signal output power carrying capability of any power amplifier in the apparatus in which it resides, including power amplifier 362. Thus, while certain description will be presented with reference to change the an RF signal output power carrying capability of power amplifier 360, embodiments may be used to change the RF signal output power carrying capability of any particular set of one or more power amplifiers in an apparatus.

In an embodiment of the invention, power amplifier bias current control circuit 350 is used to control the bias current of power amplifiers 360 in RPN 320. Such control can be fine-tuned with high resolution using a Digital to Analog Converter (DAC) 336.

In another embodiment of the invention, internal computerized component 334, or a different electrical circuit, is configured to produce a different DC supply voltage from DC power supply 340 for the operation of power amplifier 360. The bias current and/or DC supply voltage can be controlled by internal computerized component 334 to change the RF signal output power carrying capability of power amplifier 360, and by extension, the power consumption of the power amplifier 360.

Means can be provided to a technician located remotely from RPN 320 to control and change this RF signal output power capability of power amplifier 360 as needed. Thus, the technician can change the bias of power amplifier 360 when higher RF signal power level is expected at node port 370 due to changing the application supported by RPN 320 and/or when the spectrum loading carried by RPN 320 is configured to support higher frequencies.

In another embodiment, a computerized process may consult a configuration and be employed to dynamically and automatically calculate the minimum bias current and/or the minimum DC supply voltage applied to the power amplifiers in RPN 320. This computerized process may use specific known power amplifier parameters as well as known information about the RF signal power and frequency configured at the output of RPN 320. Thus, when a different configuration of node RF signal output power is applied, or when a different RF signal spectrum composition is configured in RPN 320, the computerized process will automatically calculate the required bias current and/or DC supply voltage, that when applied to the power amplifier, that power amplifier will produce sufficient signal fidelity at its output, i.e. node port.

Note that either the node RF signal output power level or the RF signal spectrum composition at RPN 320 are not changed often, and RPN 320 may operate for several years without any such change applied.

In another embodiment, the configuration and/or computerized process may also consider, and be used to compensate for, known degradation in power amplifier linearity, and thus RF signal fidelity at the output of RPN 320, when the power amplifier degradation is associated with changes in the temperature experienced by the power amplifier. Temperature measurements from a thermal sensor attached to the power amplifier may be used to affect the calculation of the required minimum bias current and/or DC supply voltage applied to the power amplifier to ascertain sufficient amplifier linearity and signal fidelity when the temperature changes. Certain techniques that may be used by an embodiment to measure or estimate changes in the temperature experienced by a power amplifier are discussed in U.S. patent application Ser. No. 15/846,926, entitled "Estimated a Lifespan of a Power Supply," invented by Adi Bonen, filed on Dec. 19, 2017, the entire disclosure of which is hereby incorporated by reference for all purposes as if fully set forth herein.

In another embodiment, the configuration and/or computerized process may also consider, and be used to compensate for, other parameters, such as but not limited to, observed power amplifier parameters of power amplifier 360, a determined measure of degradation in power amplifier 360, and on observed environmental affected traits of power amplifier 360.

Embodiments of the invention enable great saving of the DC power required by a power amplifier, and thus, substantially reduce the power consumption of the apparatus, such as an optical node, when possible.

Embodiments of the invention may configure the power amplifier bias for a first power amplifier in an apparatus independent from the power amplifier bias for a second power amplifier in the same apparatus. Thus, in an embodiment, internal computerized component 334 may instructing power amplifier bias current control circuit 350 to change an RF signal output power carrying capability of a power amplifier 360 independently from how internal computerized component 334 instructs power amplifier bias current control circuit 350 to change the RF signal output power carrying capability of power amplifier 362.

Periodically, step 440 may be performed. In step 440, a processing unit reports data, to a remote location, about a power amplifier. For example, internal computerized component 334 may transmit data over an optical link to a CCAP Core about power amplifier 360 and/or power amplifier 362. Such data may include observations which, when processed at CCAP Core, and subsequently used as a basis for instructing internal computerized component 334 on how to perform step 420.

Non-limiting, illustrative examples of such data that may be sent by internal computerized component 334 over an optical link to a CCAP Core about power amplifier 360 include, without limitation, data about (a) a current power savings associated with the reductions in power amplifier bias from a maximum power amplifier bias associated with power amplifier 360 and (b) an accumulated power savings associated with the reductions in power amplifier bias from a maximum power amplifier bias associated with power amplifier 360.

Thus, in an embodiment, the configuration which forms the basis for how internal computerized component 334 performs step 420 may be stored external to RPN 320, e.g., such configuration may be maintained at CCAP Core. In this way, the CCAP Core may send instructions over the optical link to RPN 320 to instruct internal computerized component 334 on how to perform step 420. In alternate embodiments, such configuration may be maintained by and stored on RPD 320.

In the foregoing specification, embodiments of the invention have been described with reference to numerous specific details that may vary from implementation to implementation. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. One or more non-transitory computer-readable storage mediums storing one or more sequences of instructions for configurable adjustment of a power amplifier bias for a power amplifier, which when executed by one or more processors, cause:
    a processing unit, disposed within an apparatus, instructing an electrical circuit, also disposed within said apparatus, to change an RF signal output power carrying capability of the power amplifier based on (a) a configuration and (b) an evaluation of a required power amplifier bias deemed necessary to handle the RF signal output power of all RF signals handled by the apparatus with sufficient fidelity,
    wherein the change in the RF signal output power carrying capability of the power amplifier causes an adjustment in a power consumption of the power amplifier.

2. The one or more non-transitory computer-readable storage mediums of claim 1, wherein the apparatus is a Remote PHY node or a Remote MACPHY node.

3. The one or more non-transitory computer-readable storage mediums of claim 1, wherein the apparatus is a wireless communication device.

4. The one or more non-transitory computer-readable storage mediums of claim 1, wherein the electrical circuit changes the RF signal output power carrying capability by adjusting a bias current of the power amplifier.

5. The one or more non-transitory computer-readable storage mediums of claim 1, wherein the electrical circuit changes the RF signal output power carrying capability by adjusting DC supply voltage of the power amplifier.

6. The one or more non-transitory computer-readable storage mediums of claim 1, wherein said configuration for said apparatus is maintained external to said apparatus, and wherein said processing unit instructs said electrical circuit based on one or more instructions received remotely from said apparatus.

7. The one or more non-transitory computer-readable storage mediums of claim 1, wherein said configuration instructs said electrical circuit based, at least in part, on observed power amplifier parameters of said power amplifier.

8. The one or more non-transitory computer-readable storage mediums of claim 1, wherein said configuration instruct said electrical circuit based, at least in part, on a determined measure of degradation in the power amplifier.

9. The one or more non-transitory computer-readable storage mediums of claim 1, wherein said configuration instructs said electrical circuit based, at least in part, on observed environmental affected traits of said power amplifier.

10. One or more non-transitory computer-readable storage mediums storing one or more sequences of instructions for configurable adjustment of a power amplifier bias for a power amplifier, which when executed by one or more processors, cause:
   a processing unit, disposed within an apparatus, instructing an electrical circuit, also disposed within said apparatus, to change an RF signal output power carrying capability of the power amplifier based on a configuration,
   wherein the change in the RF signal output power carrying capability of the power amplifier causes an adjustment in a power consumption of the power amplifier; and
   the processing unit reporting, to a remote location, a current power savings associated with the reductions in power amplifier bias from a maximum power amplifier bias associated with the power amplifier.

11. One or more non-transitory computer-readable storage mediums storing one or more sequences of instructions for configurable adjustment of a power amplifier bias for a power amplifier, which when executed by one or more processors, cause:
   a processing unit, disposed within an apparatus, instructing an electrical circuit, also disposed within said apparatus, to change an RF signal output power carrying capability of the power amplifier based on a configuration,
   wherein the change in the RF signal output power carrying capability of the power amplifier causes an adjustment in a power consumption of the power amplifier; and
   the processing unit reporting, to a remote location, an accumulated power savings associated with the reductions in power amplifier bias from a maximum power amplifier bias associated with the power amplifier.

12. An apparatus for configurable adjustment of a power amplifier bias for a power amplifier, comprising:
   one or more processors; and
   one or more non-transitory computer-readable storage mediums storing one or more sequences of instructions, which when executed, cause:
      a processing unit, disposed within an apparatus, instructing an electrical circuit, also disposed within said apparatus, to change an RF signal output power carrying capability of the power amplifier based on a (a) configuration and (b) an evaluation of a required power amplifier bias deemed necessary to handle the RF signal output power of all RF signals handled by the apparatus with sufficient fidelity,
      wherein the change in the RF signal output power carrying capability of the power amplifier causes an adjustment in a power consumption of the power amplifier.

13. The apparatus of claim 12, wherein the apparatus is a Remote PHY node or a Remote MACPHY node.

14. The apparatus of claim 12, wherein the apparatus is a wireless communication device.

15. The apparatus of claim 12, wherein the electrical circuit changes the RF signal output power carrying capability by adjusting a bias current of the power amplifier.

16. The apparatus of claim 12, wherein the electrical circuit changes the RF signal output power carrying capability by adjusting DC supply voltage of the power amplifier.

17. The apparatus of claim 12, wherein said configuration for said apparatus is maintained external to said apparatus, and wherein said processing unit instructs said electrical circuit based on one or more instructions received remotely from said apparatus.

18. The apparatus of claim 12, wherein said configuration instructs said electrical circuit based, at least in part, on observed power amplifier parameters of said power amplifier.

19. The apparatus of claim 12, wherein said configuration instruct said electrical circuit based, at least in part, on a determined measure of degradation in the power amplifier.

20. The apparatus of claim 12, wherein said configuration instructs said electrical circuit based, at least in part, on observed environmental affected traits of said power amplifier.

21. An apparatus for configurable adjustment of a power amplifier bias for a power amplifier, comprising:
   one or more processors; and
   one or more non-transitory computer-readable storage mediums storing one or more sequences of instructions, which when executed, cause:
      a processing unit, disposed within an apparatus, instructing an electrical circuit, also disposed within said apparatus, to change an RF signal output power carrying capability of the power amplifier based on a configuration,
      wherein the change in the RF signal output power carrying capability of the power amplifier causes an adjustment in a power consumption of the power amplifier; and
      the processing unit reporting, to a remote location, a current power savings associated with the reductions in power amplifier bias from a maximum power amplifier bias associated with the power amplifier.

22. An apparatus for configurable adjustment of a power amplifier bias for a power amplifier, comprising:
   one or more processors; and
   one or more non-transitory computer-readable storage mediums storing one or more sequences of instructions, which when executed, cause:
      a processing unit, disposed within an apparatus, instructing an electrical circuit, also disposed within said apparatus, to change an RF signal output power carrying capability of the power amplifier based on a configuration,
      wherein the change in the RF signal output power carrying capability of the power amplifier causes an adjustment in a power consumption of the power amplifier; and
      the processing unit reporting, to a remote location, an accumulated power savings associated with the reductions in power amplifier bias from a maximum power amplifier bias associated with the power amplifier.

23. A method for configurable adjustment of a power amplifier bias for a power amplifier, comprising:

a processing unit, disposed within an apparatus, instructing an electrical circuit, also disposed within said apparatus, to change an RF signal output power carrying capability of the power amplifier based on (a) a configuration and (b) an evaluation of a required power amplifier bias deemed necessary to handle the RF signal output power of all RF signals handled by the apparatus with sufficient fidelity, wherein the change in the RF signal output power carrying capability of the power amplifier causes an adjustment in a power consumption of the power amplifier.

24. The method of claim 23, wherein the apparatus is a Remote PHY node or a Remote MACPHY node.

25. The method of claim 23, wherein the apparatus is a wireless communication device.

\* \* \* \* \*